(12) United States Patent
Bi et al.

(10) Patent No.: US 9,859,174 B1
(45) Date of Patent: Jan. 2, 2018

(54) SIDEWALL IMAGE TRANSFER STRUCTURES

(71) Applicant: INTERNATIONAL BUSINESS MACHINES CORPORATION, Armonk, NY (US)

(72) Inventors: Zhenxing Bi, Niskayuna, NY (US); Kangguo Cheng, Schenectady, NY (US); Juntao Li, Cohoes, NY (US); Xin Miao, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/191,828

(22) Filed: Jun. 24, 2016

(51) Int. Cl.
| | | |
|---|---|---|
| *H01L 21/84* | (2006.01) | |
| *H01L 29/66* | (2006.01) | |
| *H01L 21/033* | (2006.01) | |
| *H01L 27/12* | (2006.01) | |
| *H01L 21/28* | (2006.01) | |
| *H01L 29/40* | (2006.01) | |
| *H01L 21/8234* | (2006.01) | |

(52) U.S. Cl.
CPC ........ *H01L 21/845* (2013.01); *H01L 21/0332* (2013.01); *H01L 21/0337* (2013.01); *H01L 21/28123* (2013.01); *H01L 27/1211* (2013.01); *H01L 29/401* (2013.01); *H01L 29/66545* (2013.01); *H01L 21/823425* (2013.01); *H01L 21/823456* (2013.01)

(58) Field of Classification Search
CPC .............. H01L 21/846; H01L 21/0337; H01L 21/0332; H01L 21/823425; H01L 21/823456; H01L 29/401; H01L 29/66545; H01L 27/1211

See application file for complete search history.

(56) References Cited

U.S. PATENT DOCUMENTS

| | | | |
|---|---|---|---|
| 7,687,339 B1 | 3/2010 | Schultz et al. | |
| 7,699,996 B2 | 4/2010 | Furukawa et al. | |
| 7,763,531 B2 | 7/2010 | Abadeer et al. | |
| 7,960,287 B2 | 6/2011 | Johnson et al. | |
| 8,450,833 B2 | 5/2013 | Kim | |
| 8,536,009 B2 | 9/2013 | Javorka et al. | |
| 8,673,165 B2 | 3/2014 | Raghunathan et al. | |
| 8,735,296 B2 | 5/2014 | Jung et al. | |
| 8,889,561 B2 | 11/2014 | Woo et al. | |
| 9,214,360 B2 * | 12/2015 | Jang ................. H01L 21/28141 | |
| 9,236,269 B2 | 1/2016 | Kozarsky et al. | |
| 9,305,923 B1 * | 4/2016 | Ok ...................... H01L 27/0924 | |
| 9,530,772 B1 * | 12/2016 | Balakrishnan ...... H01L 27/0629 | |
| 9,634,127 B2 * | 4/2017 | Ching .............. H01L 29/66818 | |
| 2007/0292996 A1 * | 12/2007 | Abadeer ................. B07C 5/344 438/165 |  |
| 2015/0372113 A1 * | 12/2015 | Cheng ............... H01L 29/66545 257/401 | |

\* cited by examiner

*Primary Examiner* — Galina Yushina
(74) *Attorney, Agent, or Firm* — Cantor Colburn LLP; Vazken Alexanian

(57) ABSTRACT

A semiconductor device comprises a source/drain region arranged on a substrate and a first gate stack having a first length arranged on a first channel region of the substrate. A second gate stack having a second length is arranged on a second channel region of the substrate. The first length is greater than the second length.

16 Claims, 19 Drawing Sheets

SIDEWALL IMAGE TRANSFER STRUCTURES

BACKGROUND

The present invention generally relates to complimentary metal-oxide semiconductors (CMOS) and metal-oxide-semiconductor field-effect transistors (MOSFET), and more specifically, to forming MOSFETs using sidewall image transfer processes.

The MOSFET is a transistor used for switching electronic signals. The MOSFET has a source, a drain, and gate electrode. The gate electrode is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and includes n-doped source and drain regions. The pFET uses holes as the current carriers and includes p-doped source and drain regions.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length may be achieved in a given region of the substrate as opposed to a planar FET device.

As CMOS scales to smaller dimensions, nanowire devices provide advantages. A nanowire is often suspended above the substrate by source/drain regions or the gate stack. Since the nanowire is suspended, the channel region of a nanowire device has 360 degrees of exposed area. The gate stack may be formed around the channel region of the nanowire to form a gate-all-around-device. The nanowire may provide even more surface area and greater channel length than a finFET device or planar FET device in a given region of a substrate. Nanowire FETs may be formed from stacked nanowires providing even greater layout density. Stacked nanowires provide, for example, increased drive current within a given layout area.

Gate spacers form an insulating film along gate sidewalls. Gate spacers may also initially be formed along sacrificial gate sidewalls in replacement gate technology. The gate spacers are used to define source/drain regions in active areas of a semiconductor layer located adjacent to the gate.

Device scaling in the semiconductor industry reduces costs, decreases power consumption, and provides faster devices with increased functions per unit area. Improvements in optical lithography have played a major role in device scaling. However, optical lithography has limitations for minimum dimensions and pitch, which are determined by the wavelength of the irradiation.

SUMMARY

According to an embodiment of the present invention, a method for forming a semiconductor device comprises forming a layer of sacrificial gate material on an initial oxide layer on an active region. A first sacrificial mandrel is formed on the layer of sacrificial gate material, and a second sacrificial mandrel is formed on the layer of sacrificial gate material, where the first sacrificial mandrel is formed from a first sacrificial material and the second sacrificial mandrel is formed from a second sacrificial material. A first oxide layer is formed on the first sacrificial mandrel and a second oxide layer on the second sacrificial mandrel, the first oxide layer having a thickness that is less than the second oxide layer. The first sacrificial mandrel and the second sacrificial mandrel are removed to define a first spacer and a second spacer, the first spacer having a width that is greater than a width of the second spacer. Exposed portions of the layer of sacrificial gate material are removed to expose the initial oxide layer on the active region and form a first sacrificial gate and a second sacrificial gate over channel regions of the active region. A spacer is formed adjacent to the first sacrificial gate and a spacer is formed adjacent to the second sacrificial gate. An insulator layer is deposited over a source/drain region. The first sacrificial gate and the second sacrificial gate are removed to form a first cavity and a second cavity that expose channel regions of the active region. A first gate stack is formed in the first cavity and a second gate stack is formed in the second cavity.

According to another embodiment of the present invention, a method for forming a semiconductor device comprises forming a semiconductor fin, and forming a layer of sacrificial gate material on an initial oxide layer on the semiconductor fin. A first sacrificial mandrel is formed on the layer of sacrificial gate material and a second sacrificial mandrel is formed on the layer of sacrificial gate material, where the first sacrificial mandrel is formed from a first sacrificial material and the second sacrificial mandrel is formed from a second sacrificial material. A first oxide layer is formed on the first sacrificial mandrel and a second oxide layer is formed on the second sacrificial mandrel, the first oxide layer having a thickness that is less than the second oxide layer. The first sacrificial mandrel and the second sacrificial mandrel are removed to define a first spacer and a second spacer, the first spacer having a width that is greater than a width of the second spacer. Exposed portions of the layer of sacrificial gate material are removed to expose the initial oxide layer on the semiconductor fin and form a first sacrificial gate and a second sacrificial gate over channel regions of the semiconductor fin. A spacer is formed adjacent to the first sacrificial gate and a spacer adjacent to the second sacrificial gate. An insulator layer over a source/drain region. The first sacrificial gate and the second sacrificial gate are removed to form a first cavity and a second cavity that expose channel regions of the semiconductor fin. A first gate stack is formed in the first cavity and a second gate stack is formed in the second cavity.

According to yet another embodiment of the present invention, a semiconductor device comprises a source/drain region arranged on a substrate and a first gate stack having a first length arranged on a first channel region of the substrate. A second gate stack having a second length is arranged on a second channel region of the substrate. The first length is greater than the second length.

DETAILED DESCRIPTION

The methods and resultant structures described herein provide for forming semiconductor devices using a sidewall image transfer process.

In some integrated circuits it is desirable to form semiconductor devices where the gates have different lengths. For example, two gate stacks arranged on a wafer where the length of the gate stacks are different. In this regard, an exemplary sidewall image transfer process is used to form the gate stacks.

Figure 1:
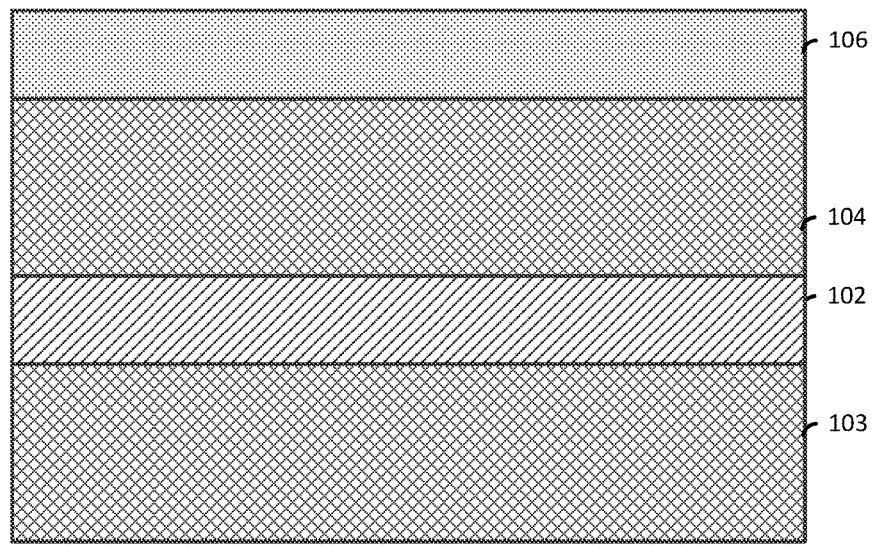
FIG. 1 illustrates a side view of a semiconductor-on-insulator (SOI) wafer.

FIG. 1 illustrates a side view of a semiconductor-on-insulator (SOI) wafer 101. In an alternative embodiment, the substrate may be formed from a bulk semiconductor. The SOI wafer 101 includes a substrate 103, an insulator layer 102 arranged on the substrate 103, a semiconductor layer 104 arranged on the insulator layer 102, and a hardmask 106 arranged on the semiconductor layer 104.

The SOI wafer 101 can be formed by any suitable technique such as, for example wafer bonding, Smartcut™, SIMOX (Separation by IMplanted Oxygen). The semiconductor layer 104 may be a silicon-containing material. Illustrative examples of silicon-containing materials suitable for the semiconductor layer 104 or for a bulk semiconductor may include, but are not limited to, silicon, silicon germanium, silicon germanium carbide, silicon carbide, polysilicon, epitaxial silicon, amorphous silicon, and multilayers thereof. Although silicon is predominately used in wafer fabrication, alternative semiconductor materials can be employed, such as, but not limited to, germanium, gallium nitride, cadmium telluride and zinc selenide. Further alternatives for the semiconductor layer 104 include III-V compound semiconductors. The term "III-V compound semiconductor" denotes a semiconductor material that includes at least one element from Group III of the Periodic Table of Elements (International Union of Pure and Applied Chemistry Group 13) and at least one element from Group V of the Periodic Table of Elements (International Union of Pure and Applied Chemistry Group 15). Typically, the III-V compound semiconductors are binary, ternary or quaternary alloys including III/V elements. Examples of III-V compound semiconductors that can be used in the present embodiments include, but are not limited to alloys of gallium arsenic, aluminum arsenic, indium gallium arsenic, indium aluminum arsenic, indium aluminum arsenic antimony, indium aluminum arsenic phosphorus, indium gallium arsenic phosphorus and combinations thereof.

The semiconductor substrate 103 may include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate may also comprise an organic semiconductor or a layered semiconductor such as, for example, Si/SiGe, a silicon-on-insulator or a SiGe-on-insulator. A portion or entire semiconductor substrate may be amorphous, polycrystalline, or monocrystalline. In addition to the aforementioned types of semiconductor layers, the semiconductor substrate employed in the present invention may also comprise a hybrid oriented (HOT) semiconductor layer in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain. It is understood that while examples described herein and in the figures are directed toward silicon semiconductor devices, these structures and/or material compositions are merely exemplary, and that the structures and processes described herein may be applied to any semiconductor device or material composition now known or later developed.

The insulator layer 102 may include, for example, a buried oxide (BOX) material or other suitable insulator materials. Examples of suitable insulator materials include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

The thickness of insulator layer 102 generally varies and is not intended to be limited. In one aspect, the thickness of the insulator layer 102 is in a range from about 10 nm to about 1000 nm. The insulator layer 102 can be formed by any suitable process such as thermal oxidation, thermal nitridation, chemical vapor deposition (CVD).

A hardmask layer 106 is arranged on the semiconductor layer 104. The hardmask 106 may include, for example, silicon oxide, silicon nitride (SiN), SiOCN, SiBCN or any suitable combination of those. The hardmask 106 may be deposited using a deposition process, including, but not limited to, PVD, CVD, PECVD, or any combination thereof.

Figure 2A:
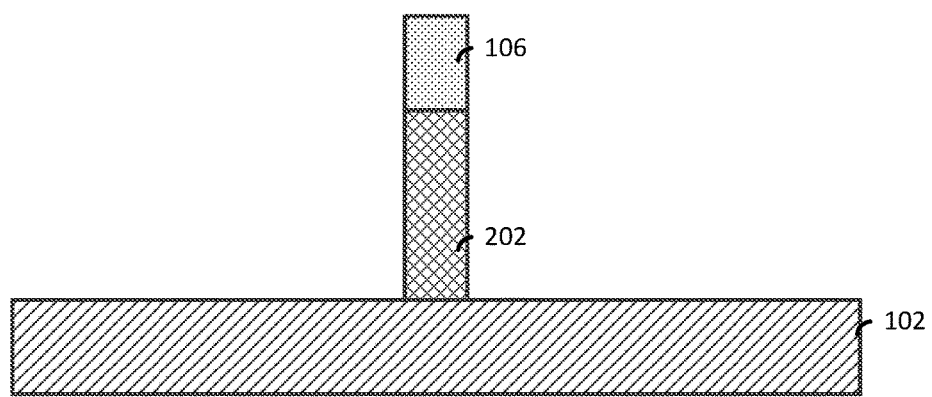
FIG. 2A illustrates a cut-away view along the line A-A (of FIG. 2B) following the formation of a fin on the insulator layer.
Figure 2B:
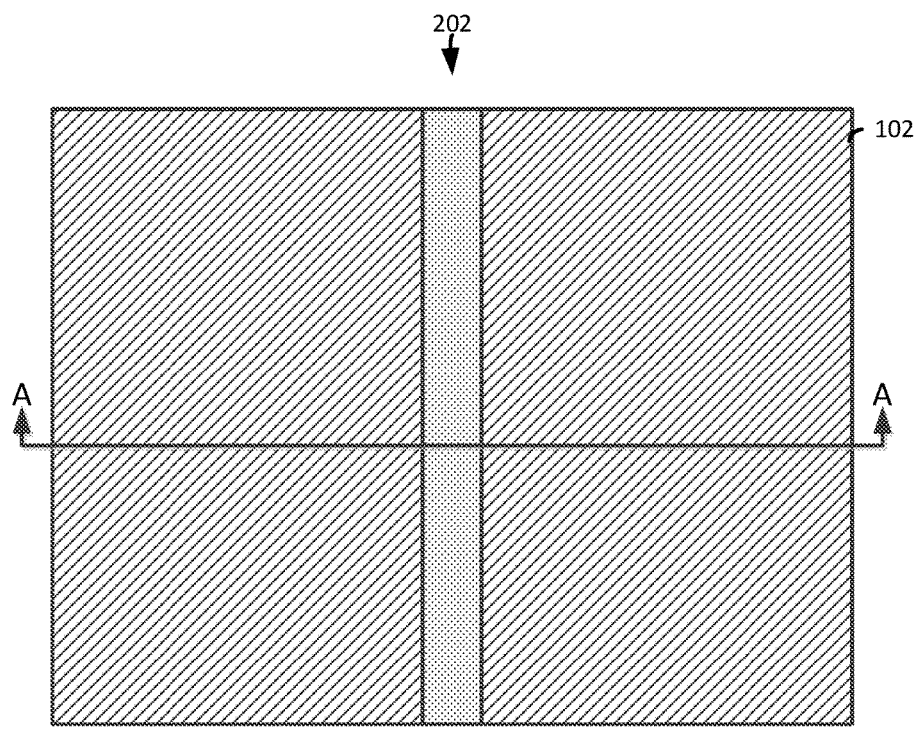
FIG. 2B illustrates a top view of the fin arranged on the insulator layer.

FIG. 2A illustrates a cut-away view along the line A-A (of FIG. 2B) following the formation of a fin 202 on the insulator layer 102. The fin 202 may be patterned by, for example, a lithographic patterning and etching process such as, reactive ion etching (RIE) or a sidewall imaging transfer process that removes exposed portions of the hardmask 106 and portions of the semiconductor layer 104 to expose portions of the insulator layer 102. FIG. 2B illustrates a top view of the fin 202 arranged on the insulator layer 102.

Figure 3:
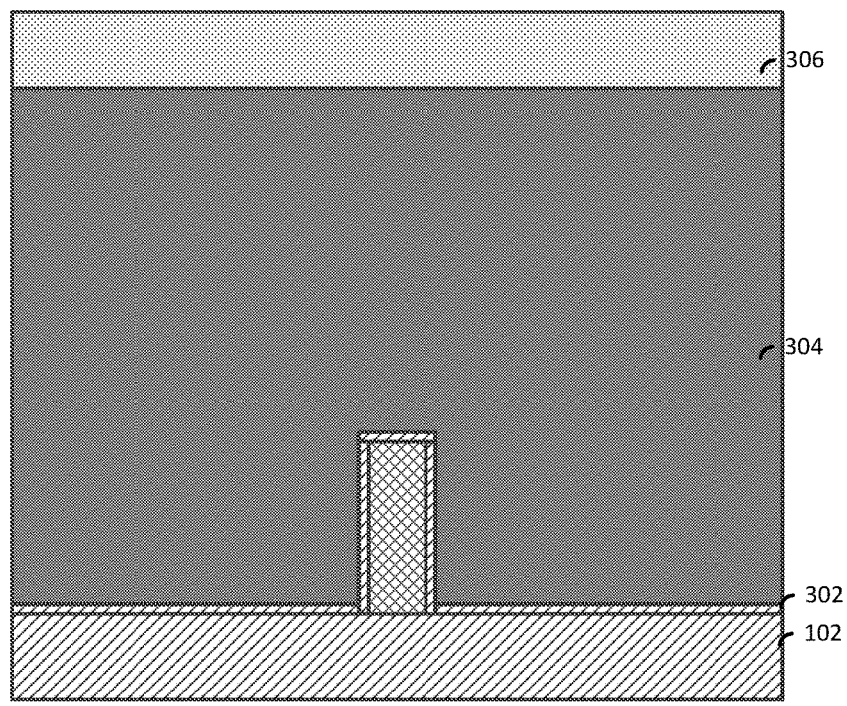
FIG. 3 illustrates a cut-away view following the formation of an oxide layer over exposed portions of the fin and the insulator layer following the removal of the hardmask.

FIG. 3 illustrates a cut-away view following the formation of an oxide layer 302 over exposed portions of the fin 202 and the insulator layer 102 following the removal of the hardmask 106. A layer of sacrificial gate material 304 such as, for example, amorphous silicon (aSi), or polycrystalline silicon (polysilicon) material or another suitable sacrificial gate material is deposited over the oxide layer 302. The sacrificial gates 1102 and 1104 shown in FIG. 11A may further comprise a sacrificial gate dielectric material such as silicon oxide between the fin.

The layer sacrificial gate material 304 may be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hardmask 306 such as, for example, silicon oxide, silicon nitride (SiN), SiOCN, SiBCN or any suitable combination of those materials, is deposited on the layer of sacrificial gate material 304 to form a PC hard mask or sacrificial gate cap 306. The hardmask 306 may be deposited using a deposition process, including, but not limited to, PVD, CVD, PECVD, or any combination thereof.

Figure 4:
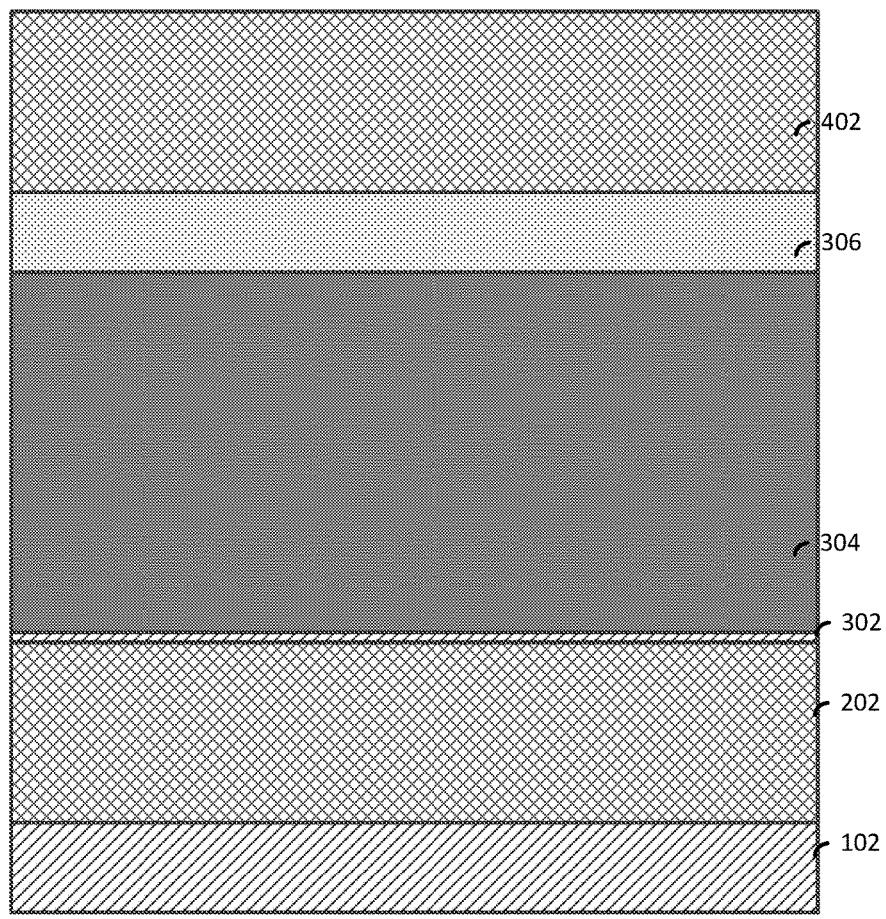
FIG. 4 illustrates a cut-away view along the longitudinal axis of the fin following the deposition of a sacrificial semiconductor layer over the hardmask.

FIG. 4 illustrates a cut-away view along the longitudinal axis of the fin 202 following the deposition of a sacrificial semiconductor layer 402 over the hardmask 306. The sacrificial semiconductor layer 402 in the illustrated embodiment includes silicon that may be deposited by, for example, chemical vapor deposition or plasma enhanced chemical vapor deposition.

Figure 5:
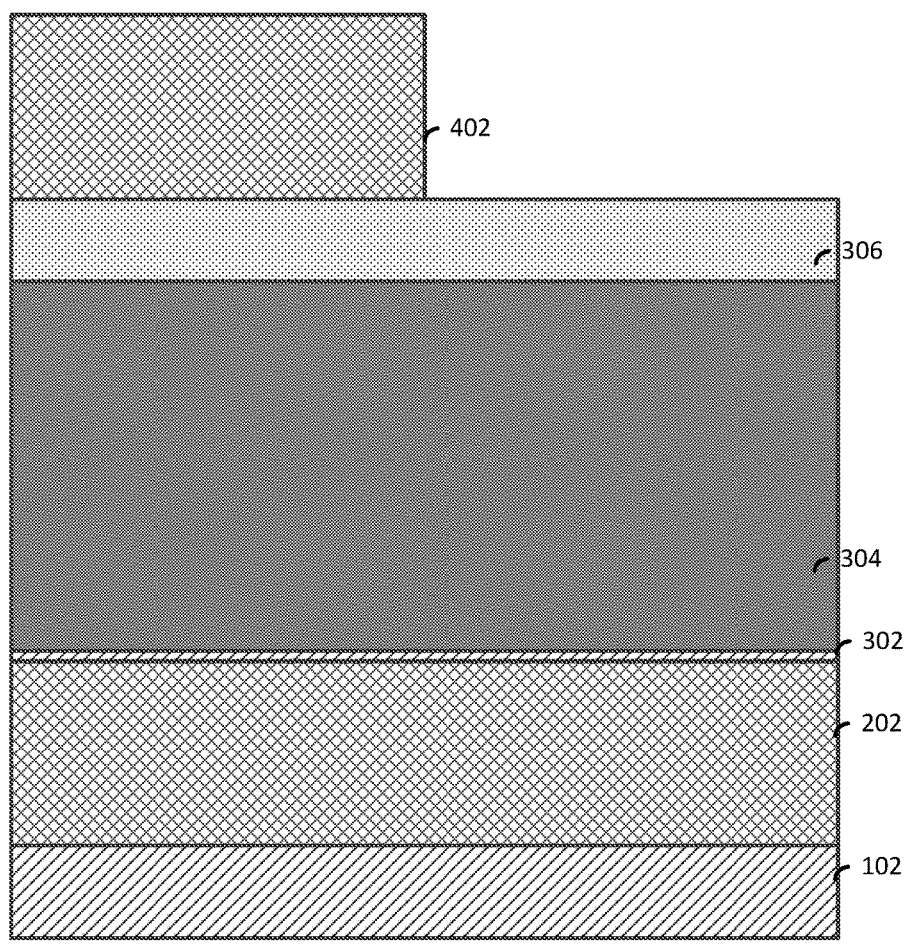
FIG. 5 illustrates a cut-away view following a lithographic patterning and etching process that patterns a mask (not shown) on a portion of the sacrificial semiconductor layer and removes exposed portions of the sacrificial semiconductor layer.

FIG. 5 illustrates a cut-away view following a lithographic patterning and etching process that patterns a mask (not shown) on a portion of the sacrificial semiconductor layer 402 and removes exposed portions of the sacrificial semiconductor layer 402 to expose portions of the hardmask 306.

Figure 6:
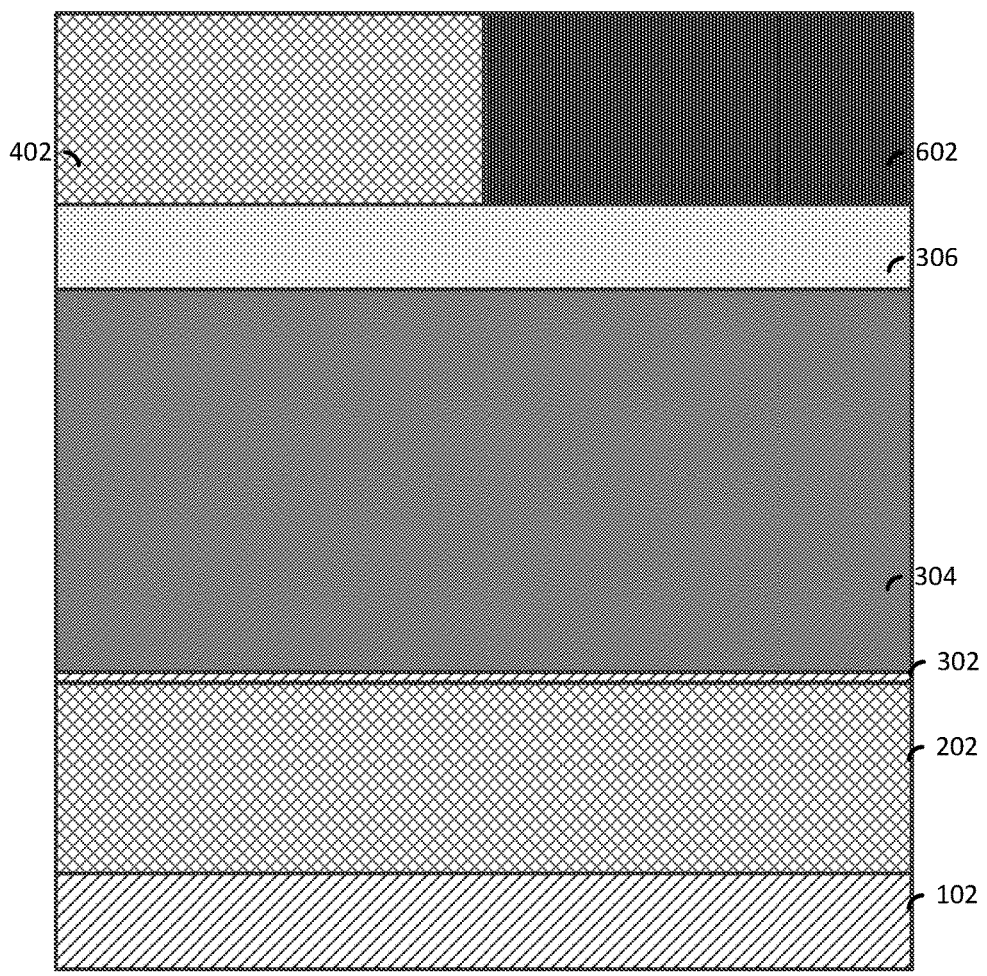
FIG. 6 illustrates a cut-away view following the deposition of a second sacrificial semiconductor material on exposed portions of the hardmask.

FIG. 6 illustrates a cut-away view following the deposition of a second sacrificial semiconductor material 602 on exposed portions of the hardmask 306. The second sacrificial semiconductor material 602 in the illustrated embodiment includes a SiGe material. The second sacrificial semiconductor material 602 may be formed by, for example, a chemical vapor deposition process or a plasma vapor deposition process. Following the deposition of the second sacrificial semiconductor material 602, a planarizing process, such as, chemical mechanical polishing may be performed to form the resultant structure of FIG. 6.

Figure 7:
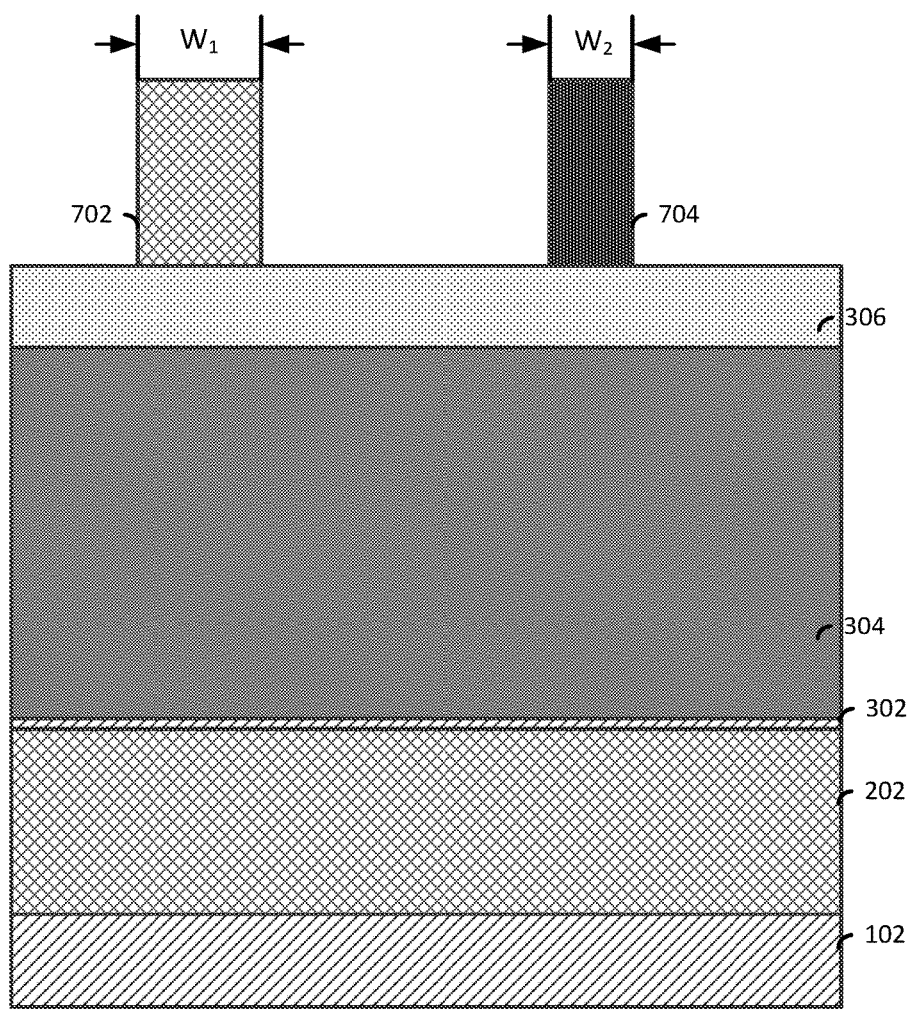
FIG. 7 illustrates a cut-away view following a lithographic patterning and etching process that removes exposed portions of the sacrificial semiconductor layer and the second sacrificial semiconductor material to form a first sacrificial mandrel and a second sacrificial mandrel.

FIG. 7 illustrates a cut-away view following a lithographic patterning and etching process that removes exposed portions of the sacrificial semiconductor layer 402 and the second sacrificial semiconductor material 602 to form a first sacrificial mandrel 702 from the sacrificial semiconductor layer 402 and forms a second sacrificial mandrel 704 from the second sacrificial semiconductor material 602. In the illustrated exemplary embodiment, the width of the first sacrificial mandrel 702 is $W_1$ and the width of the second sacrificial mandrel 704 is $W_2$. The widths $W_1$ and $W_2$ may be substantially similar or dissimilar where $W_1 > W_2$ or $W_1 < W_2$.

Figure 8:
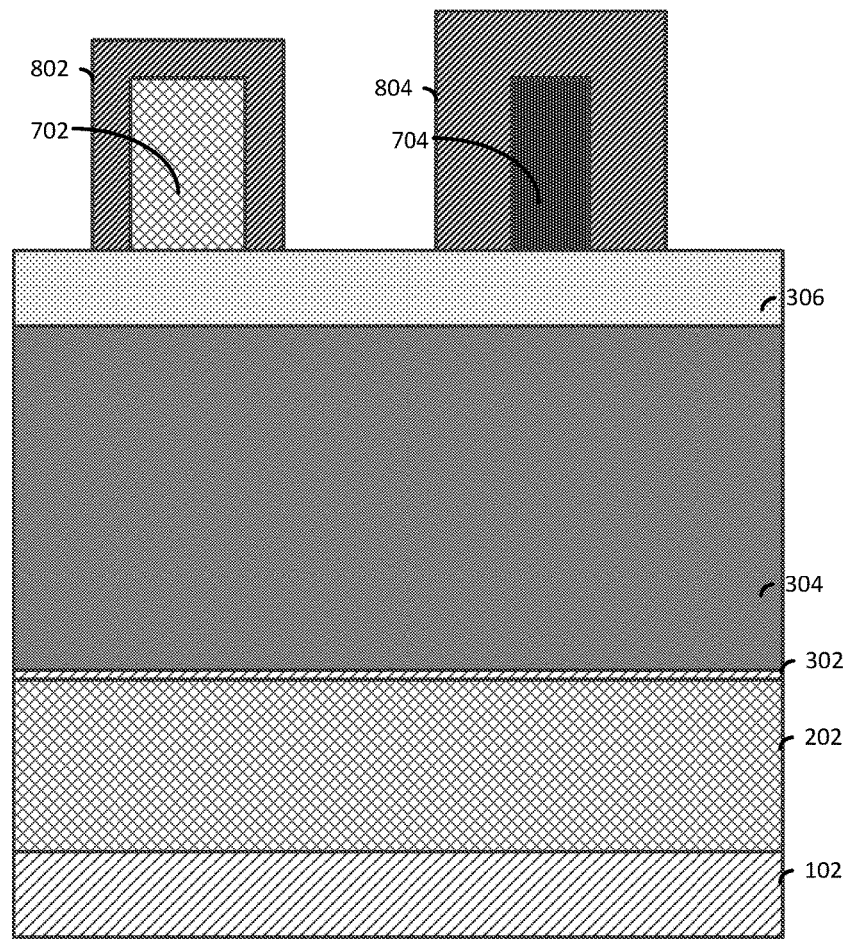
FIG. 8 illustrates a cut-away view following the formation of an oxide layer over the sacrificial mandrel and an oxide layer over the sacrificial mandrel.

FIG. 8 illustrates a cut-away view following the formation of an oxide layer 802 over the sacrificial mandrel 702 and an oxide layer 804 over the sacrificial mandrel 704. The oxidation process is performed at a temperature sufficient enough to cause oxidation of the sacrificial mandrel 702 and 704. In an embodiment of the present invention, the oxidation is performed at a temperature of about 500° C. In accordance with an embodiment of the present invention, the oxidation is performed in an oxidizing ambient which includes at least one oxygen-containing gas such as, for example, $O_2$, NO, $N_2O$, ozone, water steam, air and other like oxygen-containing gases. The oxygen-containing gases may be admixed with each other (such as an admixture of $O_2$ and NO), or the gas may be diluted with an inert gas such as, for example, He, Ar, $H_2$ $N_2$, Xe, Kr, or Ne. In an embodiment, the oxidation process is performed in a so-called wet oxidation environment with water (reaction of hydrogen with oxygen). During the wet oxidation process, water steam diffuses into the sacrificial mandrel 702 and 704 and converts it into oxide.

The oxide layer 802 is thinner than the oxide layer 804 due to the different rates of oxidation of the sacrificial mandrel 702 and the sacrificial mandrel 704.

Figure 9:
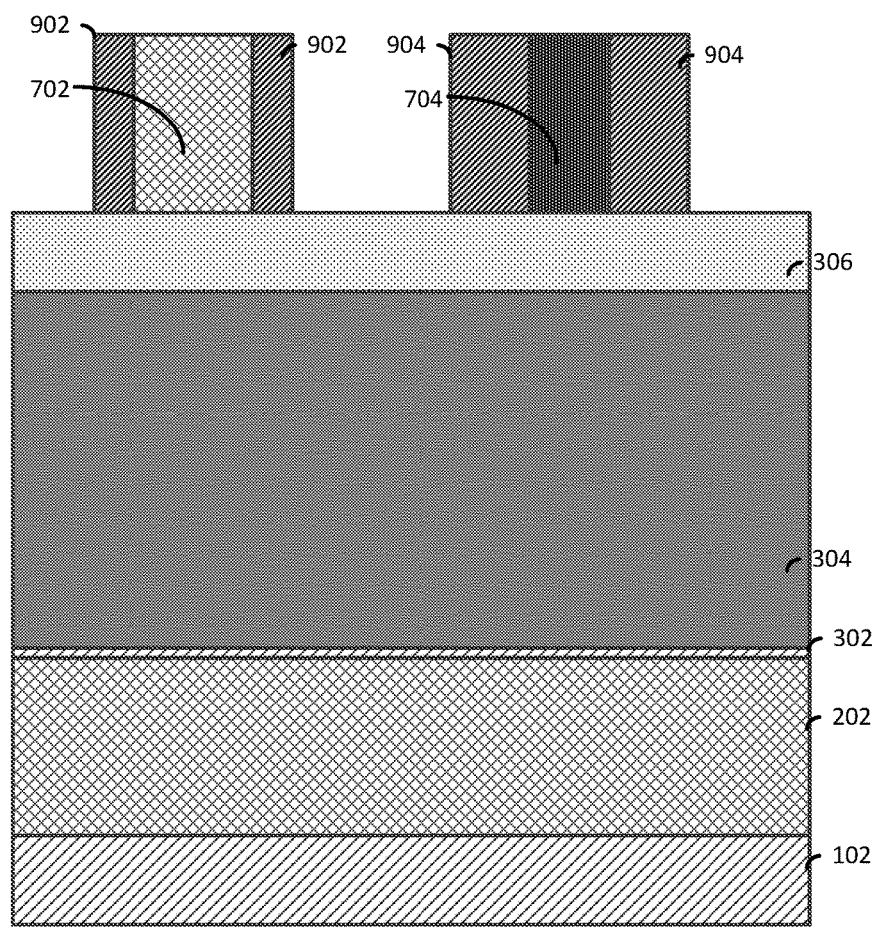
FIG. 9 illustrates a cut-away view following the formation of spacers.

FIG. 9 illustrates a cut-away view following the formation of spacers 902 and spacers 904. The spacers 902 and 904 are formed by an anisotropic etching process such as, reactive ion etching that removes exposed portions of the oxide layers 802 and 804 (of FIG. 8) to expose portions of the sacrificial mandrel 702 and the sacrificial mandrel 704.

Figure 10:
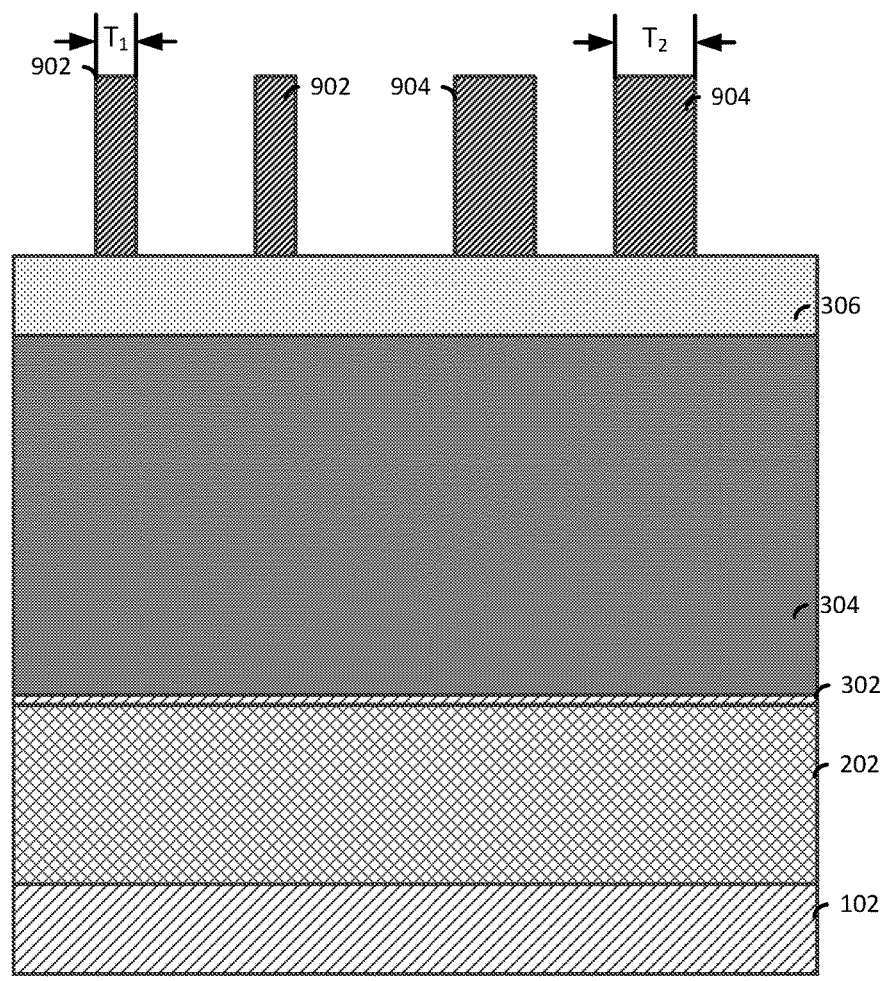
FIG. 10 illustrates a cut-away view following the removal of the sacrificial mandrel and the sacrificial mandrel using a suitable selective etching process.

FIG. 10 illustrates a cut-away view following the removal of the sacrificial mandrel 702 and the sacrificial mandrel 704 using a suitable selective etching process. The resultant spacers 902 have a width $T_1$ and the spacers 904 have a width $T_2$, where $T_1 < T_2$.

Figure 11A:
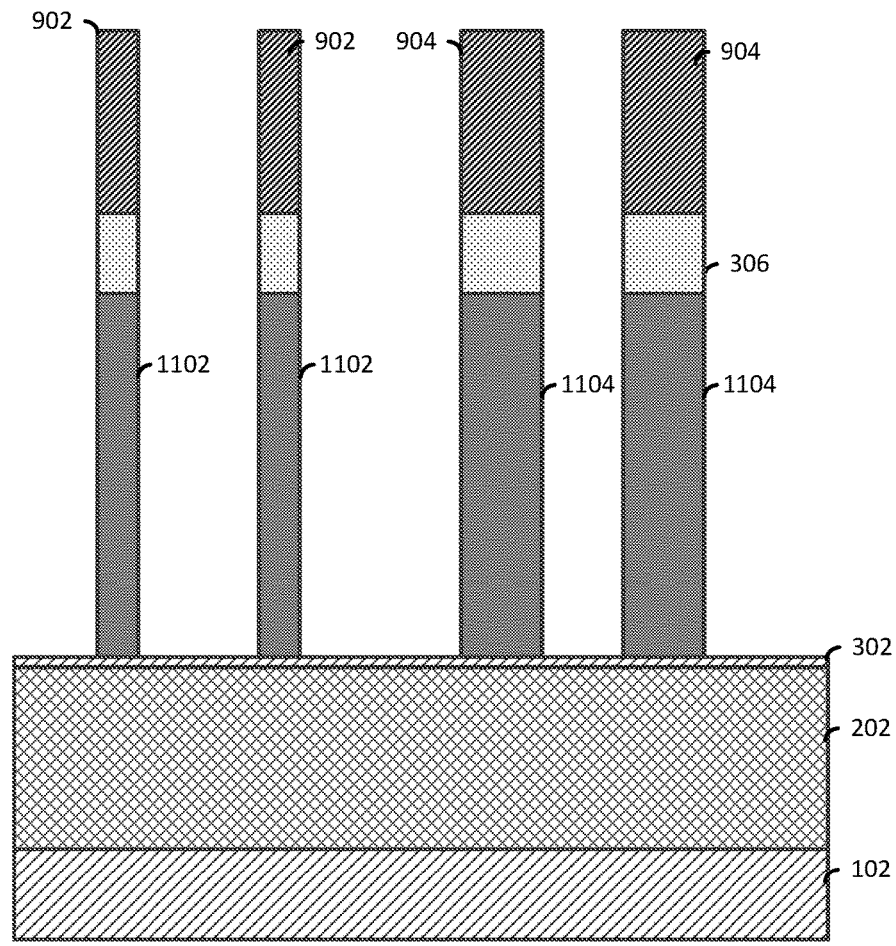
FIG. 11A illustrates a cut-away view along the line A-A (of FIG. 11B) following an anisotropic etching process that removes exposed portions of the hardmask and the layer of sacrificial gate material to expose portions of the oxide layer and form sacrificial gates.

FIG. 11A illustrates a cut-away view along the line A-A (of FIG. 11B) following an anisotropic etching process that removes exposed portions of the hardmask 306 and the layer of sacrificial gate material 304 to expose portions of the oxide layer 302 and form sacrificial gates 1102 and 1104 having lengths $T_1$ and $T_2$ respectively.

Figure 11B:
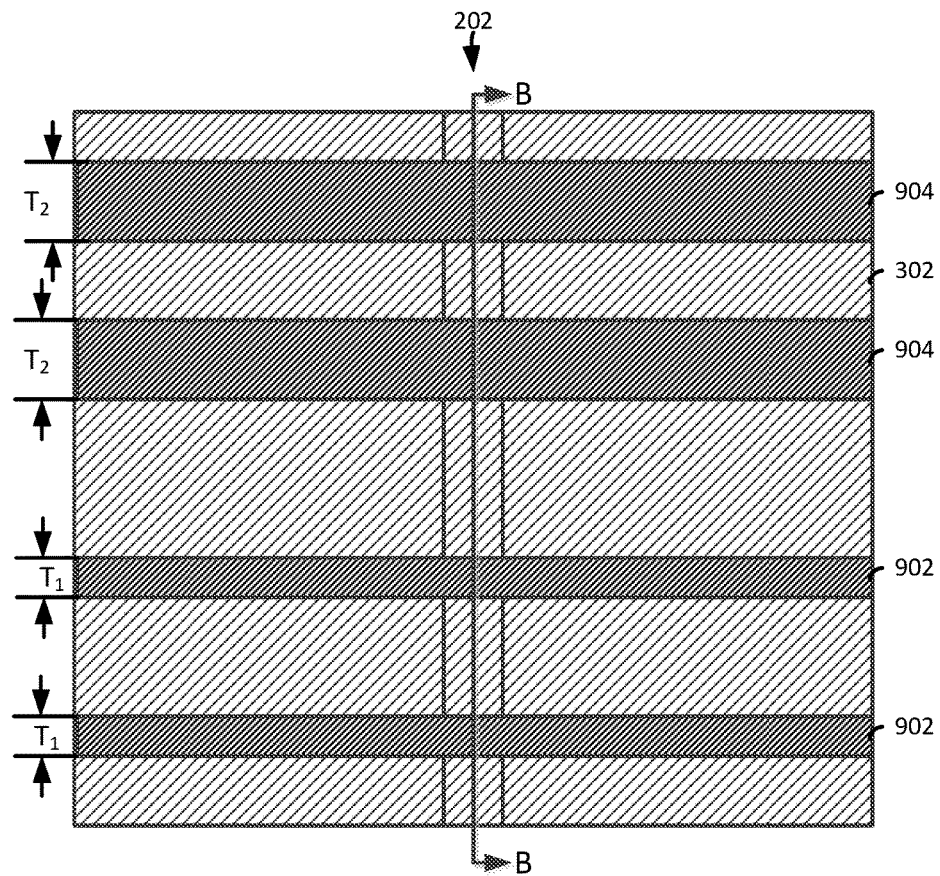
FIG. 11B illustrates a top view following the formation of the sacrificial gates (of FIG. 11A).

FIG. 11B illustrates a top view following the formation of the sacrificial gates 1102 and 1104 (of FIG. 11A).

Figure 12:
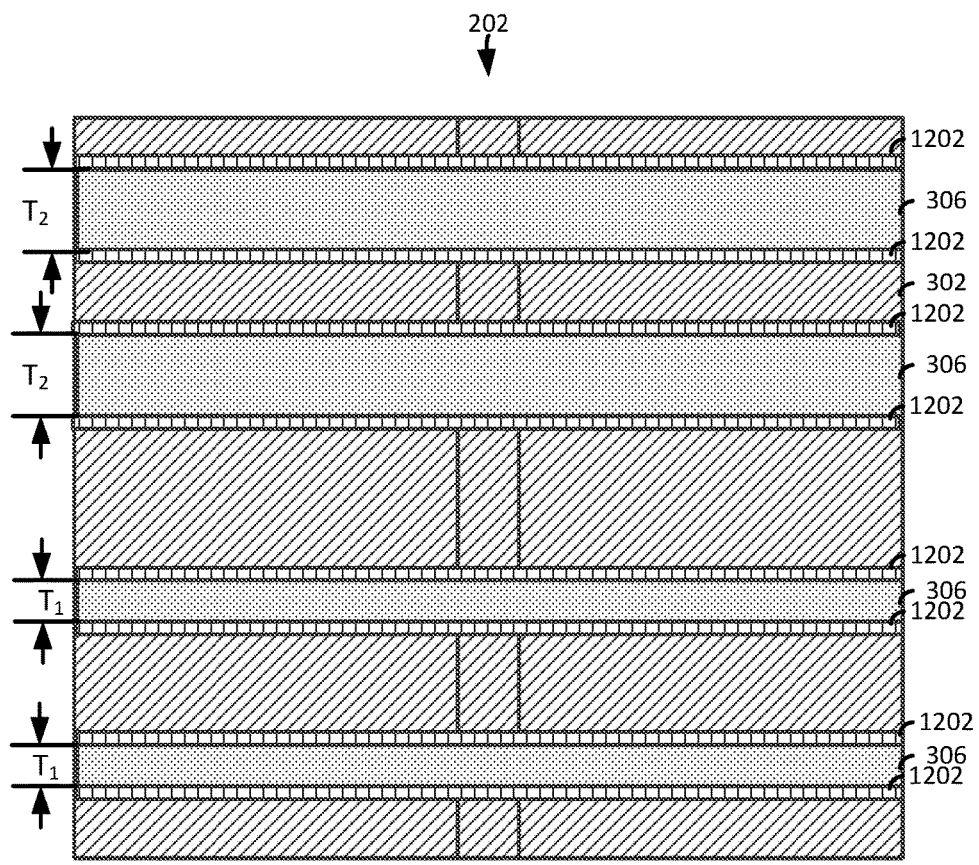
FIG. 12 illustrates a top view following the removal of the spacers and the formation of spacers adjacent to sidewalls of the sacrificial gates.

FIG. 12 illustrates a top view following the removal of the spacers 902 and 904 and the formation of spacers 1202 adjacent to sidewalls of the sacrificial gates 1102 and 1104 (of FIG. 11A).

The spacers 1202 in the illustrated embodiment are formed by depositing a layer of spacer material (not shown) over the exposed portions of the oxide layer 302, the fin 202, and the sacrificial gates 1102 and 1104. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Following the deposition of the layer of spacer material, a suitable anisotropic etching process such as, for example, a reactive ion etching process is performed to remove portions of the layer of spacer material and form the spacers 1202.

Figure 13:
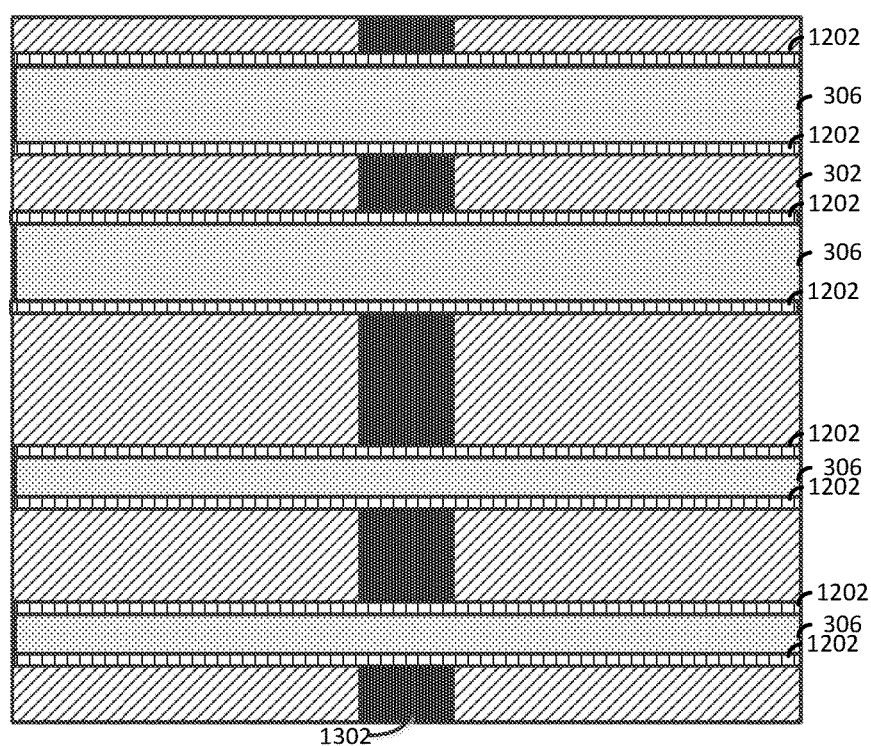
FIG. 13 illustrates a top view following the formation of source/drain regions.

FIG. 13 illustrates a top view following the formation of source/drain regions 1302. The source/drain regions 1302 are formed by an epitaxial growth process that deposits a crystalline overlayer of semiconductor material onto the exposed crystalline seed material of the exposed fin 202 to form the source/drain regions 1302.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-3}$, or preferably between $2\times10^{20}$ cm$^{-3}$ to $1\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Figure 14:
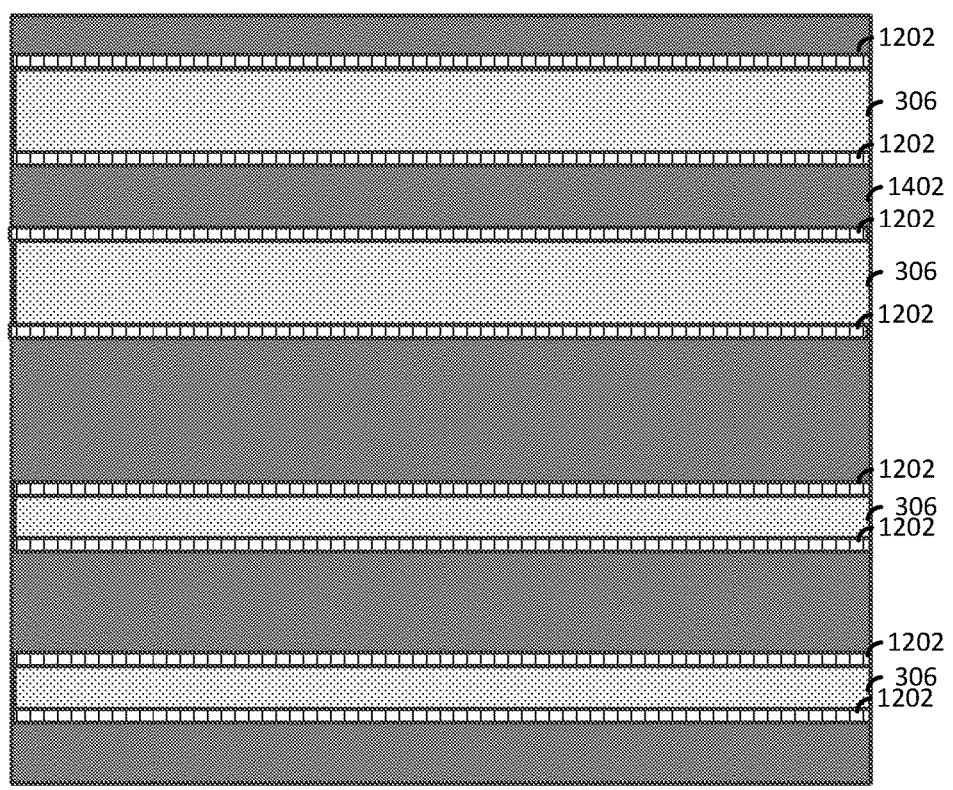
FIG. 14 illustrates a top view following the formation of an inter-level dielectric layer.

FIG. 14 illustrates a top view following the formation of an inter-level dielectric layer 1402. The inter-level dielectric layer 1402 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 1402 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1402, a planarization process such as, for example, chemical mechanical polishing is performed.

Figure 15:
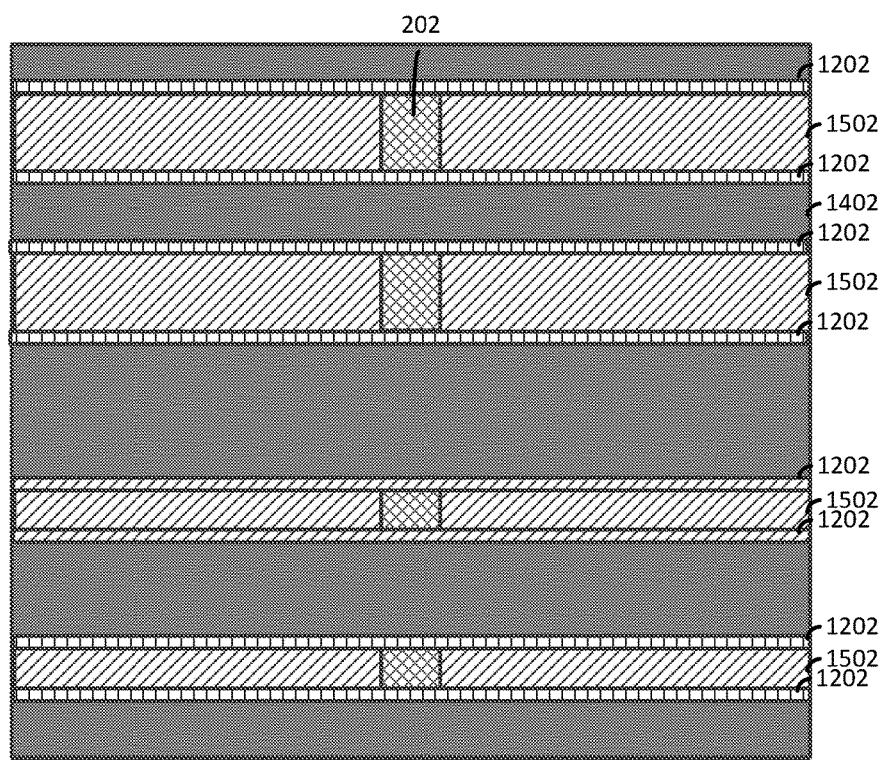
FIG. 15 illustrates a top view following the removal of the sacrificial gates of FIG. 11A to form cavities that expose the channel regions of the fin.

FIG. 15 illustrates a top view following the removal of the sacrificial gates 902 and 904 of FIG. 11A to form cavities 1502 that expose the channel regions of the fins 202. The sacrificial gates 1102 and 1104 may be removed by performing a dry etch process, for example, RIE, followed by a wet etch process. The wet etch process is selective to (will not substantially etch) the spacers 1202 and the inter-level dielectric material. The chemical etch process may include, but is not limited to, hot ammonia or tetramethylammonium hydroxide (TMAH).

Figure 16A:
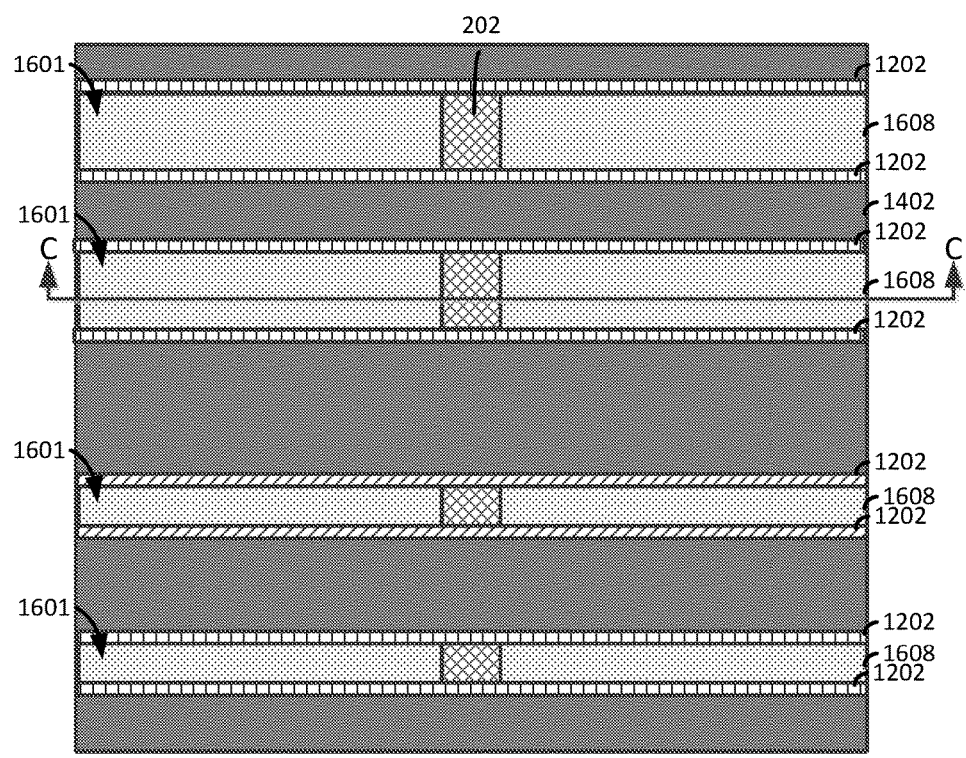
FIG. 16A illustrates a top view of the resultant structure following the formation of a replacement metal gate stack (gate stack).
Figure 16B:
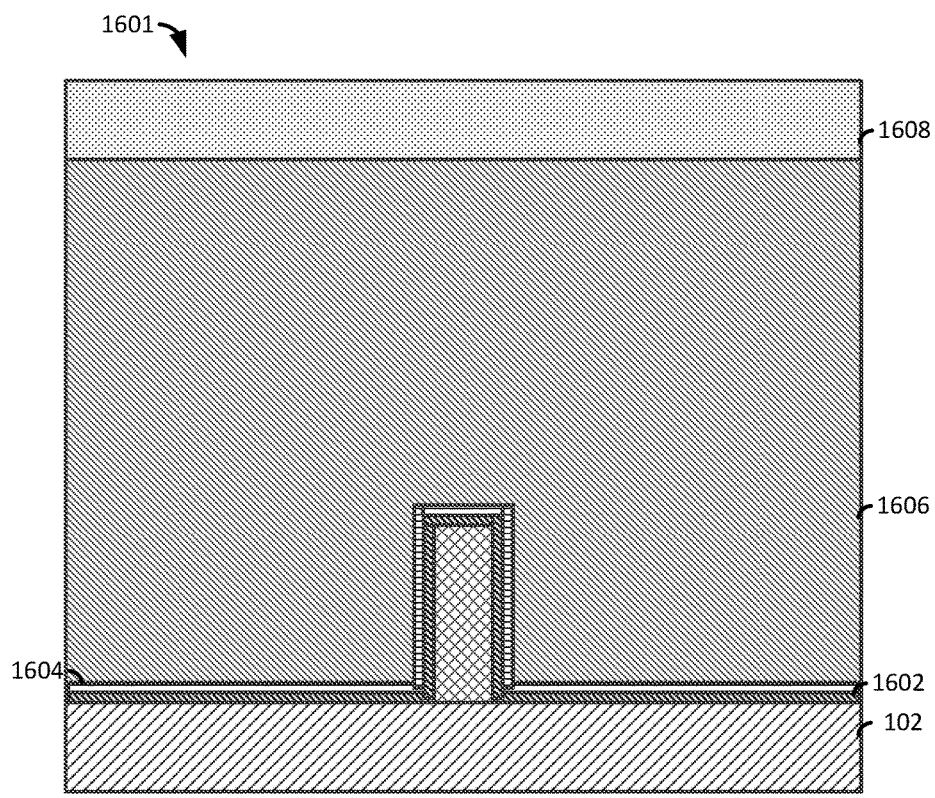
FIG. 16B illustrates a cut-away view along the line C-C (of FIG. 16A) of the gate stack.

FIG. 16A illustrates a top view of the resultant structure following the formation of a replacement metal gate stack (gate stack) 1601. FIG. 16B illustrates a cut-away view along the line C-C (of FIG. 16A) of the gate stack 1601. The gate stack 1601 include high-k metal gates formed, for example, by filling the cavity 1502 (of FIG. 15) with one or more gate dielectric 1602 materials, one or more workfunction metals 1604, and one or more metal gate conductor 1606 materials. The gate dielectric 1602 material(s) can be a dielectric material having a dielectric constant greater than 3.9, 7.0, or 10.0. Non-limiting examples of suitable materials for the dielectric 1602 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric 1602 materials may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) 1604 may be disposed over the gate dielectric 1602 material. The type of work function metal(s) 1604 depends on the type of transistor and may differ between the nFET and pFET devices. Non-limiting examples of suitable work function metals 1604 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor 1606 material(s) is deposited over the gate dielectric 1602 materials and work function metal(s) 1604 to form the gate stack 1601. Non-limiting examples of suitable conductive metals include aluminum (Al), platinum (Pt), gold (Au), tungsten (W), titanium (Ti), or any combination thereof. The gate conductor 1606 material(s) may be deposited by a suitable deposition process, for example, CVD, PECVD, PVD, plating, thermal or e-beam evaporation, and sputtering.

Following the deposition of the gate dielectric 1602 materials, the work function metal(s) 1604, and the gate conductor 1606 material(s), planarization process, for example, chemical mechanical planarization (CMP), is performed to remove the overburden of the deposited gate materials, followed by deposition of hardmask 1608, to form the gate stack 1601.

After the gate stack 1601 is formed, additional insulating material (not shown) may be deposited over the device(s). The insulating material may be patterned to form cavities (not shown) that expose portions of the source/drain region 1302 and the gate stack 1601. The cavities may be filled by a conductive material (not shown) and, in some embodiments, a liner layer (not shown) to form conductive contacts (not shown).

The methods and resultant structures described herein provide for forming oxide sidewall image transfer spacers having different widths. The sidewall image transfer spacers are used to pattern sacrificial gate stacks that have different lengths that result in metal gates having different channel lengths.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a semiconductor device, the method comprising:

forming a layer of sacrificial gate material on an initial oxide layer on an active region;

forming a first sacrificial mandrel on the layer of sacrificial gate material and forming a second sacrificial mandrel on the layer of sacrificial gate material, where the first sacrificial mandrel is formed from a first sacrificial material and the second sacrificial mandrel is formed from a second sacrificial material;

forming a first oxide layer on the first sacrificial mandrel and a second oxide layer on the second sacrificial mandrel, the first oxide layer having a thickness that is less than the second oxide layer;

removing the first sacrificial mandrel and the second sacrificial mandrel to define a first spacer and a second spacer, the first spacer having a width that is less than a width of the second spacer;

removing exposed portions of the layer of sacrificial gate material to expose the initial oxide layer on the active region and form a first sacrificial gate and a second sacrificial gate over channel regions of the active region;

forming a spacer adjacent to the first sacrificial gate and a spacer adjacent to the second sacrificial gate;

depositing an insulator layer over a source/drain region;

removing the first sacrificial gate and the second sacrificial gate to form a first cavity and a second cavity that expose channel regions of the active region; and forming a first gate stack in the first cavity and a second gate stack in the second cavity.

2. The method of claim 1, further comprising forming a hardmask on the layer of sacrificial gate material prior to forming first sacrificial mandrel on the layer of sacrificial gate material.

3. The method of claim 1, wherein the first sacrificial material includes Si and the second sacrificial material includes SiGe.

4. The method of claim 1, wherein the first sacrificial material is dissimilar from the second sacrificial material.

5. The method of claim 1, wherein the first sacrificial material has a slower oxidation rate than the second sacrificial material.

6. The method of claim 1, wherein the first sacrificial mandrel and the second sacrificial mandrel are formed by:
   forming a hardmask on the layer of sacrificial gate material;
   forming a layer of the first sacrificial material on the hardmask;
   removing a portion of the first sacrificial material to expose a portion of the hardmask;
   depositing the second sacrificial material on the exposed portions of the hardmask; and
   patterning and removing portions of the first sacrificial material and the second sacrificial material to expose portions of the hardmask and form the first sacrificial mandrel and the second sacrificial mandrel.

7. The method of claim 1, wherein the layer of sacrificial gate material includes amorphous silicon.

8. The method of claim 1, wherein the second gate stack has a greater length than the second gate stack.

9. A method for forming a semiconductor device, the method comprising:
   forming a semiconductor fin;
   forming a layer of sacrificial gate material on an initial oxide layer on the semiconductor fin;
   forming a first sacrificial mandrel on the layer of sacrificial gate material and forming a second sacrificial mandrel on the layer of sacrificial gate material, where the first sacrificial mandrel is formed from a first sacrificial material and the second sacrificial mandrel is formed from a second sacrificial material;
   forming a first oxide layer on the first sacrificial mandrel and a second oxide layer on the second sacrificial mandrel, the first oxide layer having a thickness that is less than the second oxide layer;
   removing the first sacrificial mandrel and the second sacrificial mandrel to define a first spacer and a second spacer, the first spacer having a width that is less than a width of the second spacer;
   removing exposed portions of the layer of sacrificial gate material to expose the initial oxide layer on the semiconductor fin and form a first sacrificial gate and a second sacrificial gate over channel regions of the semiconductor fin;
   forming a spacer adjacent to the first sacrificial gate and a spacer adjacent to the second sacrificial gate;
   depositing an insulator layer over a source/drain region;
   removing the first sacrificial gate and the second sacrificial gate to form a first cavity and a second cavity that expose channel regions of the semiconductor fin; and
   forming a first gate stack in the first cavity and a second gate stack in the second cavity.

10. The method of claim 9, further comprising forming a hardmask on the layer of sacrificial gate material prior to forming first sacrificial mandrel on the layer of sacrificial gate material.

11. The method of claim 9, wherein the first sacrificial material is dissimilar from the second sacrificial material.

12. The method of claim 9, wherein the first sacrificial mandrel and the second sacrificial mandrel are formed by:
   forming a hardmask on the layer of sacrificial gate material;
   forming a layer of the first sacrificial material on the hardmask;
   removing a portion of the first sacrificial material to expose a portion of the hardmask;
   depositing the second sacrificial material on the exposed portions of the hardmask; and
   patterning and removing portions of the first sacrificial material and the second sacrificial material to expose portions of the hardmask and form the first sacrificial mandrel and the second sacrificial mandrel.

13. The method of claim 9, wherein the layer of sacrificial gate material includes amorphous silicon.

14. The method of claim 9, wherein the second gate stack has a greater length than the second gate stack.

15. The method of claim 9, wherein the semiconductor fin is arranged on an insulator layer.

16. The method of claim 9, wherein the spacer adjacent to the first sacrificial gate includes a nitride material.

* * * * *